United States Patent
Mizusawa et al.

(10) Patent No.: US 9,441,791 B2
(45) Date of Patent: *Sep. 13, 2016

(54) GAS SUPPLY UNIT, SUBSTRATE PROCESSING APPARATUS AND SUPPLY GAS SETTING METHOD

(71) Applicant: TOKYO ELECTRON LIMITED, Minato-ku (JP)

(72) Inventors: Kenetsu Mizusawa, Nirasaki (JP); Keiki Ito, Nirasaki (JP); Masahide Itoh, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 958 days.

This patent is subject to a terminal disclaimer.

(21) Appl. No.: 13/691,125

(22) Filed: Nov. 30, 2012

(65) Prior Publication Data

US 2013/0092322 A1 Apr. 18, 2013

Related U.S. Application Data

(60) Continuation of application No. 12/651,165, filed on Dec. 31, 2009, now Pat. No. 8,906,193, which is a division of application No. 11/296,209, filed on Dec. 8, 2005, now abandoned.

(60) Provisional application No. 60/639,795, filed on Dec. 29, 2004.

(30) Foreign Application Priority Data

Dec. 9, 2004 (JP) .................................. 2004-357292

(51) Int. Cl.
 *F17D 1/04* (2006.01)
 *G05D 11/13* (2006.01)
 (Continued)

(52) U.S. Cl.
 CPC ........... *F17D 1/04* (2013.01); *C23C 16/45512* (2013.01); *C23C 16/45561* (2013.01);
 (Continued)

(58) Field of Classification Search
 CPC .................. H01L 21/67069; H01L 21/67253; H01J 37/3244; H01J 37/32449; F17D 1/04; G05D 11/132; Y10T 137/0329; Y10T 137/2496; Y10T 137/87346; Y10T 137/0335; Y10T 137/0352; C23C 16/45512; C23C 16/45561; C23C 16/52
 See application file for complete search history.

(56) References Cited

U.S. PATENT DOCUMENTS 5,916,369 A 6/1999 Anderson et al.
5,958,140 A 9/1999 Arami et al.
(Continued)

FOREIGN PATENT DOCUMENTS

JP 62-054442 3/1987
JP 8-158072 6/1996
(Continued)

*Primary Examiner* — Jeffrie R Lund
(74) *Attorney, Agent, or Firm* — Oblon, McClelland, Maier & Neustadt, L.L.P.

(57) ABSTRACT

A gas supply unit, for supplying a gas into a processing chamber in which a substrate is processed, includes a plurality of gas supply sources, a mixing line for mixing a plurality of gases supplied from the gas supply sources to make a gaseous mixture, a multiplicity of branch lines for branching the gaseous mixture to be supplied to a multiplicity of places in the processing chamber, and an additional gas supply unit for supplying a specified additional gas to a gaseous mixture flowing in at least one branch line. The gas supply unit also includes pressure gauges and valves for adjusting gas flow rates in the branch lines, respectively, and a pressure ratio controller for controlling that gaseous mixtures branched into the branch lines to have a specified pressure ratio by adjusting opening degrees of the valves based on measurement results obtained by using the pressure gauges.

12 Claims, 6 Drawing Sheets

(51) Int. Cl.
*C23C 16/455* (2006.01)
*C23C 16/52* (2006.01)
*H01L 21/67* (2006.01)
*H01J 37/32* (2006.01)

(52) U.S. Cl.
CPC ......... *G05D11/132* (2013.01); *H01J 37/3244* (2013.01); *H01J 37/32449* (2013.01); *H01L 21/67069* (2013.01); *H01L 21/67253* (2013.01); *Y10T 137/0329* (2015.04); *Y10T 137/0335* (2015.04); *Y10T 137/0352* (2015.04); *Y10T 137/2496* (2015.04); *Y10T 137/87346* (2015.04)

(56) References Cited

U.S. PATENT DOCUMENTS

| | | | |
|---|---|---|---|
| 7,169,231 B2 | 1/2007 | Larson et al. | |
| 7,371,332 B2 | 5/2008 | Larson et al. | |
| 7,896,967 B2* | 3/2011 | Hayasaka | C23C 16/455 118/696 |
| 8,221,638 B2* | 7/2012 | Mizusawa | C23C 16/45557 216/58 |
| 8,236,380 B2* | 8/2012 | Mizusawa | C23C 16/455 118/50 |
| 8,375,893 B2* | 2/2013 | Mizusawa | C23C 16/45557 118/723 E |
| 8,561,572 B2* | 10/2013 | Mizusawa | C23C 16/45557 118/723 E |
| 8,701,593 B2* | 4/2014 | Mizusawa | C23C 16/455 118/663 |
| 8,790,529 B2* | 7/2014 | Hayasaka | C23C 16/455 137/1 |
| 8,821,742 B2* | 9/2014 | Yoshida | H01J 37/32901 156/345.34 |
| 8,906,193 B2* | 12/2014 | Mizusawa | G05D 11/132 156/345.24 |
| 2003/0198741 A1 | 10/2003 | Uchida et al. | |
| 2004/0050325 A1 | 3/2004 | Samoilov et al. | |
| 2004/0050326 A1 | 3/2004 | Thilderkvist et al. | |
| 2004/0112540 A1 | 6/2004 | Larson et al. | |
| 2005/0005994 A1 | 1/2005 | Sugiyama et al. | |
| 2005/0189074 A1* | 9/2005 | Kasai | G05D 16/2026 156/345.33 |
| 2006/0042754 A1* | 3/2006 | Yoshida | H01J 37/32091 156/345.1 |
| 2006/0124169 A1* | 6/2006 | Mizusawa | G05D 11/132 137/7 |
| 2007/0151668 A1* | 7/2007 | Mizusawa | C23C 16/45557 156/345.29 |
| 2007/0175391 A1* | 8/2007 | Mizusawa | C23C 16/455 118/689 |
| 2007/0181181 A1* | 8/2007 | Mizusawa | C23C 16/45565 137/1 |
| 2007/0181255 A1* | 8/2007 | Hayasaka | C23C 16/455 156/345.33 |
| 2009/0145484 A1* | 6/2009 | Mizusawa | C23C 16/455 137/1 |
| 2009/0191337 A1* | 7/2009 | Mizusawa | C23C 16/45557 427/248.1 |
| 2010/0133234 A1* | 6/2010 | Yoshida | H01J 37/32091 216/67 |
| 2010/0163112 A1* | 7/2010 | Mizusawa | G05D 11/132 137/4 |
| 2010/0312405 A1* | 12/2010 | Kono | G05D 16/206 700/285 |
| 2011/0120563 A1* | 5/2011 | Hayasaka | C23C 16/455 137/1 |
| 2011/0220609 A1* | 9/2011 | Yaegashi | H01J 37/32091 216/12 |
| 2012/0247668 A1* | 10/2012 | Mizusawa | C23C 16/45557 156/345.26 |
| 2012/0291953 A1* | 11/2012 | Mizusawa | C23C 16/455 156/345.26 |
| 2013/0092322 A1* | 4/2013 | Mizusawa | G05D 11/132 156/345.26 |
| 2013/0126093 A1* | 5/2013 | Mizusawa | C23C 16/45557 156/345.26 |
| 2013/0295774 A1* | 11/2013 | Shimizu | H01J 37/32091 438/715 |
| 2014/0116620 A1* | 5/2014 | Kuwabara | H01J 37/32568 156/345.24 |
| 2014/0332100 A1* | 11/2014 | Hayasaka | C23C 16/455 137/551 |

FOREIGN PATENT DOCUMENTS

| | | |
|---|---|---|
| JP | 9-45624 | 2/1997 |
| JP | 2000-091320 | 3/2000 |
| JP | 2004-5308 A | 1/2004 |
| JP | 2004-85134 | 3/2004 |
| JP | 2004-511905 | 4/2004 |

* cited by examiner

GAS SUPPLY UNIT, SUBSTRATE PROCESSING APPARATUS AND SUPPLY GAS SETTING METHOD

CROSS-REFERENCE TO RELATED APPLICATIONS

This application is a continuation of U.S. Ser. No. 12/651,165 filed Dec. 31, 2009, the entire content of which is hereby incorporated by reference. U.S. Ser. No. 12/651,165 is a divisional of U.S. Ser. No. 11/296,209 filed Dec. 8, 2005 which claims priority to Japanese Patent Application Number 2004-357292, filed Dec. 9, 2004 and U.S. Provisional Application No. 60/639,795, filed Dec. 29, 2004, the entire content of each are hereby incorporated by reference.

FIELD OF THE INVENTION

The present invention relates to a gas supply unit for supplying a gas to a processing chamber, a substrate processing apparatus connected to the gas supply unit and a supply gas setting method.

BACKGROUND OF THE INVENTION

In a manufacturing process of an electric device such as a semiconductor device or a liquid crystal display device, there are performed a film forming process for forming a conductive film or an insulating film on the surface of a substrate, an etching process for etching a film formed on the substrate and the like.

For example, a plasma etching apparatus is widely employed in the etching process, wherein the plasma etching apparatus includes a processing chamber for accommodating therein a substrate. In the processing chamber, there are installed a lower electrode for mounting the substrate thereon and a shower head, also serving as an upper electrode, for injecting a gas onto the substrate mounted on the lower electrode. In the etching process, while a specified gaseous mixture is injected through the shower head, a radio frequency power is applied between the electrodes. Accordingly, a plasma is generated in the processing chamber and a film formed on the substrate is etched by the plasma.

However, etching characteristics such as an etching rate and an etching selectivity are influenced by a concentration of a gas supplied onto the substrate. Further, conventionally, it has been a major challenge to improve a uniformity of etching in the surface of the substrate by making the etching characteristics uniform on the surface of the substrate. Thus, there is proposed a technique of dividing an inner space of the shower head into a plurality of gas chambers, wherein each gas chamber is independently connected to an individual gas introduction line such that a gaseous mixture containing gases whose kinds and flow rates are optionally chosen based on the necessity can be supplied to each portion in the surface of the substrate (see, e.g., Reference 1). Consequently, a partial gas concentration on a small part in the surface of the substrate can be locally controlled to thereby improve an etching uniformity on the surface of the substrate.

However, the gaseous mixture for use in the etching process contains various gases, for example, an etching gas, a gas for controlling deposits of reaction products, a carrier gas such as an inert gas, that are chosen depending on a material to be etched, process conditions and the like. Accordingly, for example, when an inner space of the shower head is divided into a plurality of gas chambers and a gas introduction line is independently connected to each of the gas chambers, as shown in FIG. 1 of Reference 2, each gas introduction line is connected to lines communicating with multiple gas supply sources and, further, a mass flow controller is provided in each line. Thus, a piping structure of a gas supply system becomes complicated and a control of gas flow rate is also complicated in each line.

Therefore, for example, a large piping space is required, which in turn increases the expense of an apparatus control system.

[Reference 1] Japanese Patent Laid-open Application No. 8-158072
[Reference 2] Japanese Patent Laid-open Application No. 9-45624

SUMMARY OF THE INVENTION

The present invention has been conceived from the above drawbacks; and it is, therefore, an object of the present invention to provide a gas supply unit capable of realizing a simple piping configuration when supplying optional gaseous mixtures to a plurality of places in a processing chamber in a substrate processing apparatus such as an etching apparatus, a substrate processing apparatus including a processing chamber connected to the gas supply unit and a supply gas setting method employing the gas supply unit.

To achieve the object, in accordance with one aspect of the present invention, there is provided a gas supply unit for supplying a gas into a processing chamber in which a substrate is processed, the gas supply unit including a plurality of gas supply sources; a mixing line for mixing a plurality of gases supplied from the gas supply sources to make a gaseous mixture; a multiplicity of branch lines for branching the gaseous mixture to be supplied to a multiplicity of places in the processing chamber; and an additional gas supply unit for supplying a specified additional gas to a gaseous mixture flowing in at least one branch line.

In accordance with the present invention, gases from a plurality of the gas supply sources are mixed in the mixing line to be branched into a multiplicity of the branch lines. Further, a specified additional gas is added to a specific branch line to adjust components or their flow rates in the gaseous mixture. In a branch line without being supplied with the additional gas, the gaseous mixture from the mixing line is supplied to the processing chamber as it is. In this case, a gaseous mixture containing common components is produced in, e.g., the mixing line and components and their flow rates in the gaseous mixture are adjusted in each branch line when necessary. Thus, the number of lines needed is minimized. As a result, optional gaseous mixtures are supplied to a plurality of places in the processing chamber by a simple piping configuration.

The gas supply unit may include pressure gauges and valves for adjusting gas flow rates in the branch lines, respectively, and a pressure ratio controller for controlling that gaseous mixtures branched into the branch lines to have a specified pressure ratio by adjusting opening degrees of the valves based on measurement results obtained by using the pressure gauges. In this case, since the flow rate in the branch line is controlled on the basis of a pressure ratio (partial pressure ratio), for example, even though a pressure in the branch line is low, the flow rate in the branch line can be adequately controlled.

In accordance with another aspect of the present invention, there is provided a substrate processing apparatus, including a processing chamber accommodating therein a substrate; a plurality of gas supply sources; a mixing line for mixing a plurality of gases supplied from the gas supply sources to make a gaseous mixture; a multiplicity of branch lines for branching the gaseous mixture to be supplied to a multiplicity of places in the processing chamber; and an additional gas supply unit for supplying a specified additional gas to a gaseous mixture flowing in at least one branch line.

In accordance with still another aspect of the present invention, there is provided a supply gas setting method using the gas supply unit which includes a plurality of gas supply sources; a mixing line for mixing a plurality of gases supplied from the gas supply sources to make a gaseous mixture; a multiplicity of branch lines for branching the gaseous mixture to be supplied to a multiplicity of places in the processing chamber; an additional gas supply unit for supplying a specified additional gas to a gaseous mixture flowing in at least one branch line; and valves and pressure gauges for adjusting gas flow rates in the branch lines, respectively, the method including the following sequential steps of controlling a pressure ratio of the gaseous mixtures branched into the branch lines to be a specified pressure ratio by adjusting the valves under a condition in which the additional gas is not supplied to said at least one branch line from the additional gas supply unit and, then, fixing opening degrees of the valves of the branch lines to values obtained under the condition; and supplying an additional gas of a specified flow rate to said at least one branch line from the additional gas supply unit.

In accordance with the present invention, a piping space and a cost of controlling flow rates can be reduced by a simple piping configuration.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
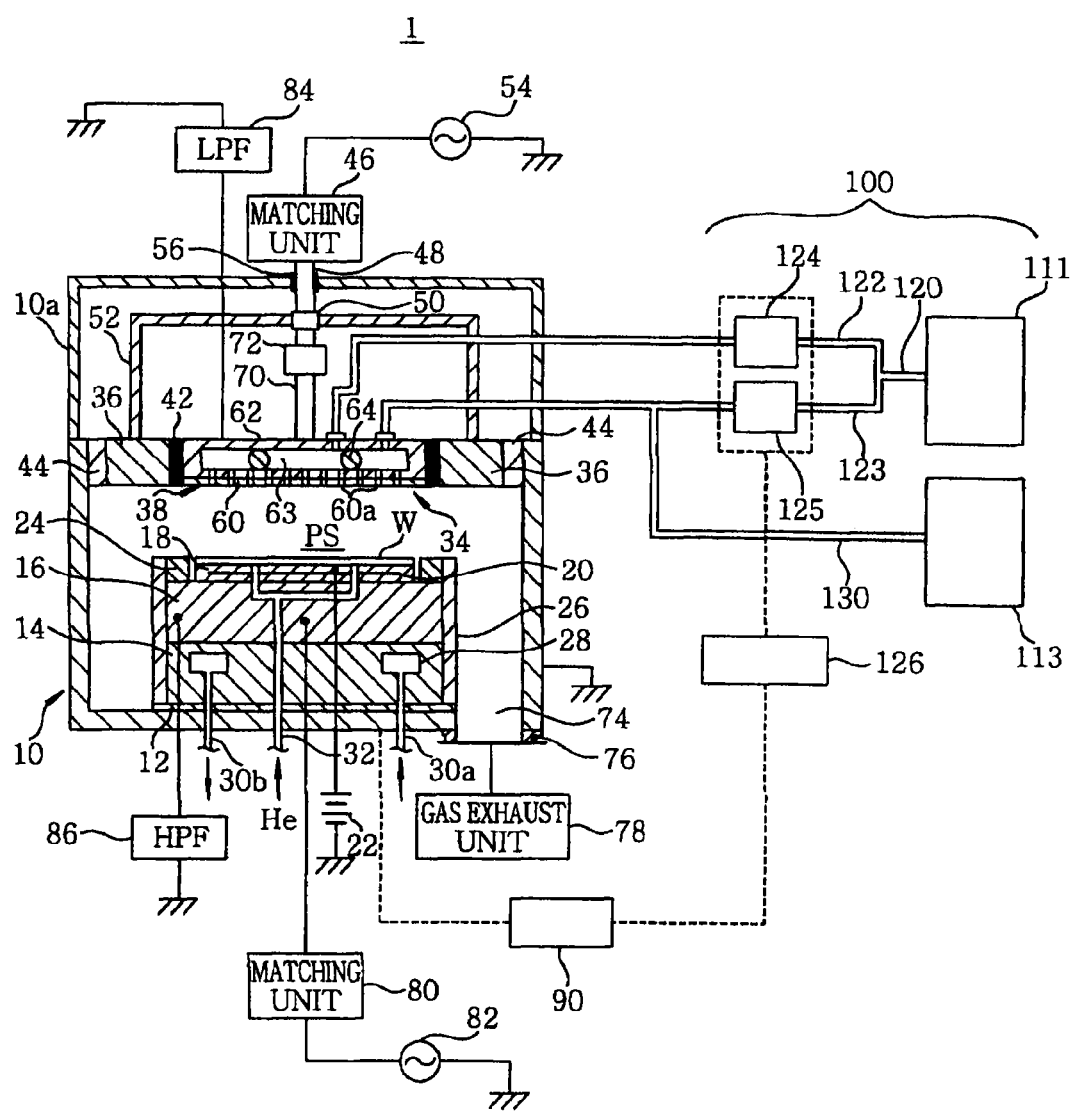
FIG. 1 is a longitudinal sectional view showing a schematic configuration of a plasma etching apparatus.

Hereinafter, a preferred embodiment of the present invention will be described. FIG. 1 is a longitudinal sectional view showing a schematic configuration of a plasma etching apparatus 1 serving as a substrate processing apparatus including a gas supply unit in accordance with the preferred embodiment of the present invention.

The plasma etching apparatus 1 is a capacitively coupled plasma etching apparatus having a parallel plate type electrode structure. The plasma etching apparatus 1 includes an approximately cylindrical processing chamber 10 that is grounded. The processing chamber 10 is formed of, e.g., aluminum alloy and the inner wall surface thereof is covered by an alumina film or an yttrium oxide film.

A cylindrical susceptor supporting table 14 is disposed in a central bottom portion of the processing chamber 10 via an insulating plate 12. A susceptor 16, serving as a mounting table, for mounting thereon a wafer W, i.e., a substrate, is disposed on the susceptor supporting table 14. Further, the susceptor 16 also serves as a lower electrode of the parallel plate type electrode structure and is formed of, e.g., aluminum alloy.

An electrostatic chuck 18 for holding the wafer W is disposed on the susceptor 16, and the electrostatic chuck 18 has an electrode 20 therein. A DC power supply 22 is electrically connected to the electrode 20. The wafer W can be adsorbed on the top surface of the susceptor 16 by Coulomb force generated by a DC voltage applied to the electrode 20 from the DC power supply 22.

A focus ring 24 is disposed on the susceptor 16 to surround the electrostatic chuck 18. A cylindrical inner wall member 26 formed of, e.g., quartz is attached to an outer peripheral surface of the susceptor 16 and the susceptor supporting table 14.

An annular coolant chamber 28 is formed inside the susceptor supporting table 14. The coolant chamber 28 communicates with a chiller unit (not shown) installed outside the processing chamber 10 via lines 30*a* and 30*b*. A coolant or cooling water is supplied into the coolant chamber 28 through the lines 30*a* and 30*b* to be circulated therein, thereby controlling the temperature of the wafer W on the susceptor 16. A gas supply line 32 passing through the susceptor 16 and the susceptor supporting table 14 reaches a top surface of the electrostatic chuck 18, whereby a thermally conductive gas such as He gas can be supplied between the wafer W and the electrostatic chuck 18.

An upper electrode 34 is disposed above the susceptor 16 to face it in parallel. A plasma generation space PS is formed between the susceptor 16 and the upper electrode 34.

The upper electrode 34 includes an annular outer upper electrode 36 and an inner upper electrode 38 of a circular plate that is disposed inwardly from the outer upper electrode 36. An annular dielectric material 42 is interposed between the outer upper electrode 36 and the inner upper electrode 38. An annular insulating shield member 44 formed of, e.g., alumina is airtightly interposed between the outer upper electrode 36 and an inner peripheral wall of the processing chamber 10.

A first radio frequency power supply 54 is electrically connected to the outer upper electrode 36 via a matching unit 46, an upper power supply rod 48, a connector 50 and a power supply case 52. The first radio frequency power supply 54 can output a radio frequency voltage having a frequency equal to or larger than 40 MHz, e.g., a frequency of 60 MHz.

The power supply case 52 is shaped like, for example, a cylinder with its bottom surface removed. A lower end portion of the power supply case 52 is connected to the outer upper electrode 36. A central portion of the top surface of the power supply case 52 is electrically connected to a lower end portion of the upper power supply rod 48 via the connector 50. An upper end portion of the upper power supply rod 48 is connected to an output side of the matching unit 46. The matching unit 46 is connected to the first radio frequency power supply 54, thereby matching an inner impedance of the first radio frequency power supply with a load impedance. The power supply case 52 is surrounded by a cylindrical ground conductor 10*a* whose sidewall has a same diameter as a sidewall of the processing chamber 10. A lower end portion of the ground conductor 10a is connected to an upper portion of the sidewall of the processing chamber 10. The upper power supply rod 48 passes through a central portion of the top surface of the ground conductor 10a, and an insulation member 56 is interposed in a portion where the upper power supply rod 48 is in contact with the ground conductor 10a.

Figure 2:
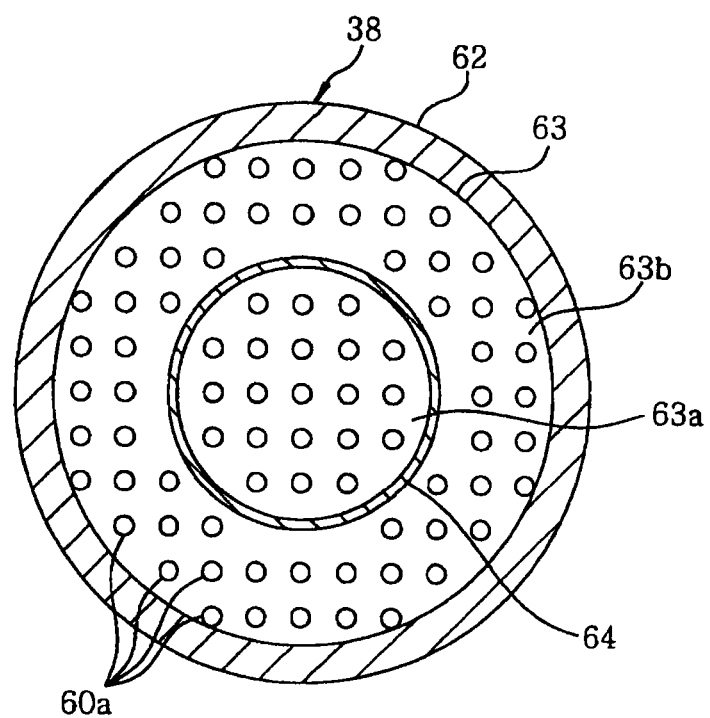
FIG. 2 shows a cross sectional view of an inner upper electrode.

The inner upper electrode 38 functions as a shower head for injecting a specified gaseous mixture toward the wafer W mounted on the susceptor 16. The inner upper electrode 38 includes a circular electrode plate 60 having a plurality of gas injection openings 60a and an electrode supporting member 62 capable of supporting the electrode plate 60 by being attached to or detached from the top surface of the electrode plate 60. The electrode supporting member 62 is shaped as a disc having a same diameter as the electrode plate 60, and a circular buffer space 63 is formed inside the electrode supporting member 62. In the buffer space 63, for example, as shown in FIG. 2, an annular partition member 64 formed of an O-ring is disposed, whereby the buffer space 63 is divided into a first buffer space 63a of a central side and a second buffer space 63b of an outer peripheral side. The first and the second buffer space 63a and 63b face a central portion and an outer peripheral portion of the wafer W loaded on the susceptor 16, respectively. The gas injection openings 60a are formed in the bottom surfaces of the buffer spaces 63a and 63b to communicate with the plasma generation space, whereby specified gaseous mixtures can be injected through the first and second buffer spaces 63a and 63b toward the central portion and the outer peripheral portion of the wafer W, respectively. Further, a gas supply unit 100 for supplying a specified gaseous mixture to each chamber in the buffer space 63 will be described later.

As depicted in FIG. 1, a lower power supply case 70 coupled to the upper power supply rod 48 is electrically connected to the top surface of the electrode supporting member 62. A variable condenser 72 is installed in the lower power supply case 70. The variable condenser 72 can adjust a relative ratio between an intensity of an electric field formed right under the outer upper electrode 36 and that formed right under the inner upper electrode 38, which are generated by a radio frequency voltage from the first radio frequency power supply 54.

A gas exhaust port 74 is formed in a bottom portion of the processing chamber 10. The gas exhaust port 74 is connected to the gas exhaust unit 78 including a vacuum pump and the like via a gas exhaust pipe 76. The processing chamber 10 can be depressurized to a desired vacuum level by using the gas exhaust unit 78.

A second radio frequency power supply 82 is electrically connected to the susceptor 16 via a matching unit 80. The second radio frequency power supply 82 can output a radio frequency voltage having a frequency ranging from, e.g., 2 MHz to 20 MHz, for example, a frequency of 20 MHz.

Electrically connected to the inner upper electrode 38 is a low pass filter 84 for passing a radio frequency wave generated from the second radio frequency power supply 82 to ground by shielding a radio frequency wave generated from the first radio frequency power supply 54. Electrically connected to the susceptor 16 is a high pass filter 86 for passing a radio frequency wave generated from the first radio frequency power supply 54 to ground.

The plasma etching apparatus 1 includes an apparatus controller 90 for controlling operations of various components such as the DC power supply 22, the first radio frequency power supply 54 and the second radio frequency power supply 82 to perform an etching.

Hereinafter, a gas supply unit 100 for supplying gaseous mixtures to the inner upper electrode 38 in the plasma etching apparatus 1 will be described.

Figure 3:
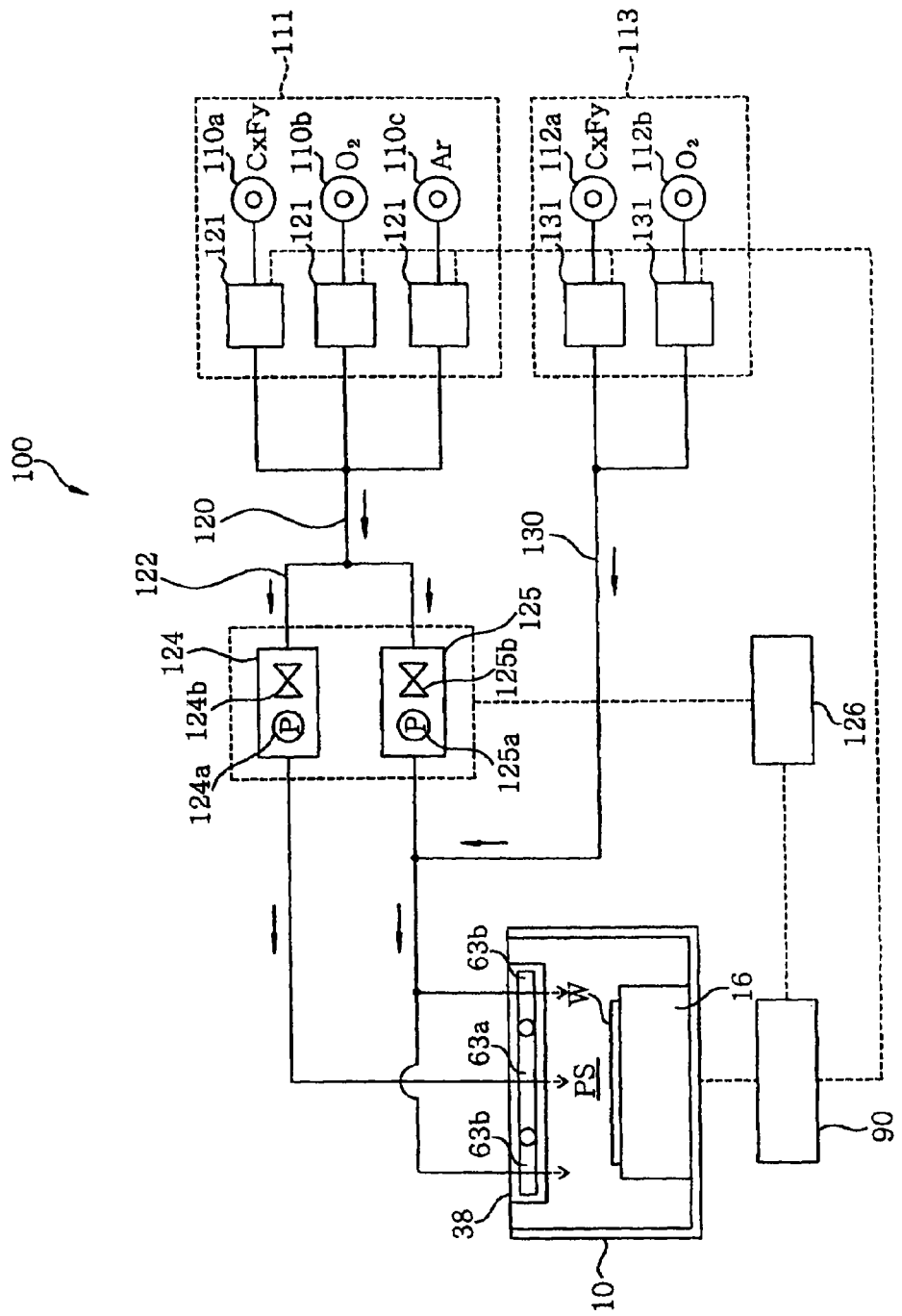
FIG. 3 explains a schematic configuration of a gas supply unit.

The gas supply unit 100, as shown in FIG. 3, includes a first gas box 111 accommodating plural, e.g., three, gas supply sources 110a, 110b and 110c and a second gas box 113 accommodating plural, e.g., two, additional gas supply sources 112a and 112b. In this embodiment, for instance, the gas supply source 110a is sealed to contain therein fluorocarbon-based fluorine compound serving as an etching gas such as $C_xF_y$ gas (e.g., $CF_4$, $C_4F_8$, $C_4F_8$ and $C_5F_8$); the gas supply source 110b is sealed to contain therein a gas for controlling deposits of CF-based reaction products, e.g., $O_2$ gas; and the gas supply source 110c is sealed to contain therein a rare gas serving as a carrier gas, e.g., an Ar gas. Further, the additional gas supply source 112a is sealed to contain therein, e.g., $C_xF_y$ gas capable of accelerating an etching, and the additional gas supply source 112b is sealed to contain therein, e.g., $O_2$ gas capable of controlling deposits of CF-based reaction products.

A mixing line 120 in which various gases from the gas supply sources 110a, 110b and 110c are combined to be mixed is connected to each of the gas supply sources 110a, 110b and 110c of the first gas box 111. In the mixing line 120, mass flow controllers 121 are installed for the gas supply sources 110a to 110c, respectively, to control flow rates of gases supplied from the gas supply sources 110a to 110c. The mixing line 120 is coupled to a first branch line 122 and a second branch line 123 for branching a gaseous mixture that is mixed in the mixing line 120. The first branch line 122 is connected to the first buffer space 63a in the inner upper electrode 38 of the processing chamber 10. The second branch line 123 is connected to the second buffer space 63b in the inner upper electrode 38.

A pressure control unit 124 is installed in the first branch line 122. In the same manner, a pressure control unit 125 is installed in the second branch line 123. The pressure control unit 124 is provided with a pressure gauge 124a and a valve 124b. Similarly, the pressure control unit 125 is provided with a pressure gauge 125a and a valve 125b. Measurement results respectively obtained by the pressure gauges 124a and 125a of the pressure control units 124 and 125 can be outputted to a pressure ratio controller 126. The pressure ratio controller 126 can control a pressure ratio, i.e., a flow rate ratio of gaseous mixtures branched into the first branch line 122 and the second branch line 123 by adjusting respective opening degrees of the valves 124b and 125b based on the measurement results obtained by using the pressure gauges 124a and 125a. Further, when setting a supply gas, while an additional gas is not supplied to the second branch line 123 from a second gas box 113 which will be described later, the pressure ratio controller 126 controls a pressure ratio of the gaseous mixtures flowing in the first branch line 122 and the second branch line 123 to be a target pressure ratio and fixes respective opening degrees of the valves 124b and 125b to values obtained under this condition.

An additional gas supply line 130 communicating with, e.g., the second branch line 123 is connected to each of additional gas supply sources 112a and 112b of the second gas box 113. For example, respective lines of the additional gas supply line 130 connected to the additional gas supply sources 112a and 112b are combined in the middle thereof and then connected to the second branch line 123. The additional gas supply line 130 is connected to a downstream side of the pressure control unit 125. In the additional gas supply line 130, mass flow controllers 131 are installed for the additional gas supply sources 112a and 112b, respectively, to control flow rates of additional gases supplied from the additional gas supply sources 112a and 112b. In this configuration, an additional gas that is chosen among gases from the second gas box 113 or obtained by mixing the gases can be supplied to the second branch line 123. Further, in this embodiment, an additional gas supply unit includes the second gas box 113, the additional gas supply sources 112a and 112b, the additional gas supply line 130 and the mass flow controller 131.

The operations of the mass flow controllers 121 in the first gas box 111 and the mass flow controllers 131 in the second gas box 113 are controlled by, e.g., the apparatus controller 90 of the plasma etching apparatus 1. Thus, various gases from the first gas box 111 and the second gas box 113 can be started or stopped to be supplied under the control of the apparatus controller 90 which also controls respective flow rates thereof.

Figure 4:
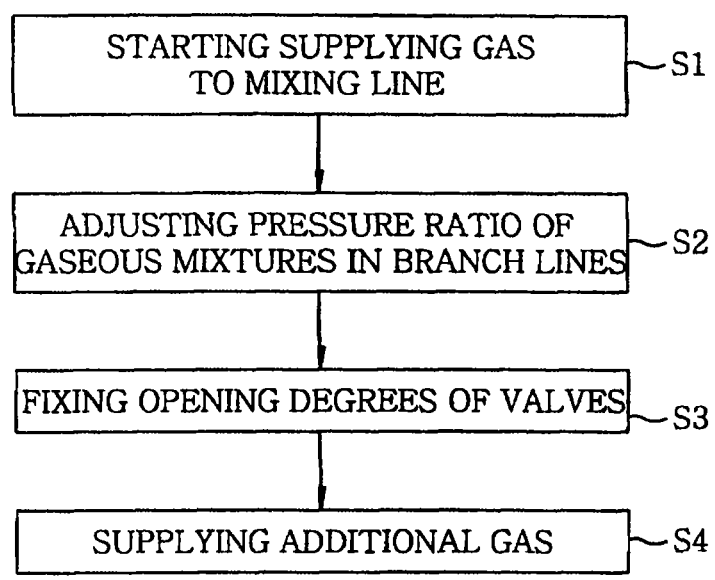
FIG. 4 is a flowchart for setting a supply gas.

Hereinafter, operations of the gas supply unit 100 having the above-mentioned configuration will be described. FIG. 4 is a flowchart for setting components or their flow rates in gaseous mixtures to be supplied into the processing chamber 10. First, a preset gas in the first gas box 111 flows at a specified flow rate in the mixing line 120 based on instruction signals of the apparatus controller 90 (step S1 in FIG. 4). For example, the $C_xF_y$ gas, $O_2$ gas and Ar gas, which are supplied at specified flow rates from the gas supply sources 110a to 110c, respectively, are mixed in the mixing line 120, thereby producing a gaseous mixture containing $C_xF_y$ gas, $O_2$ gas and Ar gas having a specified mixing ratio. Subsequently, the pressure ratio controller 126 controls opening degrees of the valves 124b and 125b based on the measurement results obtained by the pressure gauges 124a and 125a, whereby a pressure ratio of gaseous mixtures respectively flowing in the first branch line 122 and the second branch line 123 is adjusted to be a target pressure ratio (step S2 in FIG. 4). Accordingly, the components (mixing ratio) and their flow rates in the gaseous mixture supplied into the first buffer space 63a through the first branch line 122 are set. Further, at this time, at least, the same gas as the gaseous mixture supplied to the first buffer space 63a, i.e., a gaseous mixture for etching, is supplied into the second buffer space 63b through the second branch line 123.

Then, when the gaseous mixtures respectively flowing in the first branch line 122 and the second branch line 123 are controlled to have the target pressure ratio to be stable, the opening degrees of the valves 124b and 125b of the pressure control units 124 and 125 are fixed by the pressure ratio controller 126 (step S3 in FIG. 4). By an instruction signal from the apparatus controller 90 after respective opening degrees of the valves 124b and 125b being fixed, a preset additional gas in the second gas box 113 flows at a specified flow rate in the additional gas supply line 130 (step S4 in FIG. 4). An instruction signal for starting the supply of the additional gas from the second gas box 113 is sent after a setting time that is set in advance in the apparatus controller 90 elapses. The $C_xF_y$ gas, e.g., $CF_4$ gas, capable of accelerating an etching is supplied at a specified flow rate from, e.g., the additional gas supply source 112a to flow through the additional gas supply line 130 which is combined with the second branch line 123. Accordingly, the second buffer space 63b communicating with the second branch line 123 is supplied with a gaseous mixture containing a larger amount of $CF_4$ gas than the gaseous mixture supplied to the first buffer space 63a. In this manner, the components and their flow rates in the gaseous mixture supplied into the second buffer space 63b are set. Further, although the pressure ratio between the pressure in the first branch line 122 and that in the second branch line 123 is changed by supplying the additional gas into the second branch line 123, a gaseous mixture having an original flow rate is supplied into the first buffer space 63a because the valves 124b and 125b are fixed.

Further, in the plasma etching apparatus 1 having therein a depressurized atmosphere, the gaseous mixture from the first buffer space 63a is supplied to the central portion of the wafer W on the susceptor 16 and the gaseous mixture containing plenty of $CF_4$ gas from the second buffer space 63b is supplied to the outer peripheral portion of the wafer W. Accordingly, the etching characteristics of the outer peripheral portion of the wafer W are adjusted relatively to those of the central portion of the wafer W, thereby achieving uniform etching characteristics on the surface of the wafer W.

In accordance with the preferred embodiment, plural kinds of gases from the first gas box are mixed to make a gaseous mixture in the mixing line 120 and, then, the gaseous mixture are branched into the first branch line 122 and the second branch line 123, which are supplied into the first and the second buffer space 63a and 63b of the processing chamber 10, respectively. The additional gas for adjusting the etching characteristics is supplied to the second branch line 123, and the second buffer space 63b is supplied with a gaseous mixture having components and flow rates different from those in the first buffer space 63a. Therefore, components and their flow rates in gaseous mixtures supplied into the first and the second buffer space 63a and 63b can be optionally adjusted by a simple piping configuration.

Further, since flow rates in the first and the second branch line 122 and 123 are respectively adjusted by the pressure control units 124 and 125, even if the pressure of the gas supply source is very low as in the plasma etching apparatus 1, gas flow rates in supply lines can be adequately adjusted.

In the preferred embodiment, $CF_4$ gas is supplied into the second branch line 123 to accelerate an etching. However, for example, when a deposit amount of CF-based reaction products is large and an etching rate is slow in the outer peripheral portion of the wafer W compared to that of the central portion thereof, $O_2$ gas may be supplied to the second branch line 123 to remove CF-based reaction products. Further, it is possible to feed a gaseous mixture containing $CF_4$ gas and $O_2$ gas having a specified mixing ratio into the second branch line 123.

A timing of supplying the additional gas from the second gas box 113 to the second branch line 123 is preset based on the setting time of the apparatus controller 90 in the preferred embodiment. However, it is also possible to start supplying the additional gas in the manner that the apparatus controller 90 monitors the measurement results obtained by the pressure gauges 124a and 125a via the pressure ratio controller 126 and sends an instruction signal to the second gas box 113 when a stable, desired target pressure ratio is achieved.

Further, the additional gas supply sources 112a and 112b of the second gas box 113 may be connected to the first branch line 122 via the additional gas supply line 130. By doing this, components or flow rates in the gaseous mixture supplied to the first buffer space 63 can be minutely controlled when necessary.

Although the additional gas supply sources for supplying $CF_4$ gas and $O_2$ gas are installed in the second gas box 113 in the preferred embodiment, additional gas supply sources may supply other additional gases capable of accelerating or suppressing an etching, e.g., $C_xH_yF_z$ gas such as $CHF_3$, CH$_2$F$_2$, CH$_3$F for accelerating an etching, N$_2$ gas or CO gas for controlling CF-based reaction products, Xe gas or He gas for a dilution gas and the like. Besides, the number or kinds of gases accommodated in the first and the second gas box 111 and 113 can be optionally chosen depending on a material to be etched, process conditions and the like.

Figure 5:
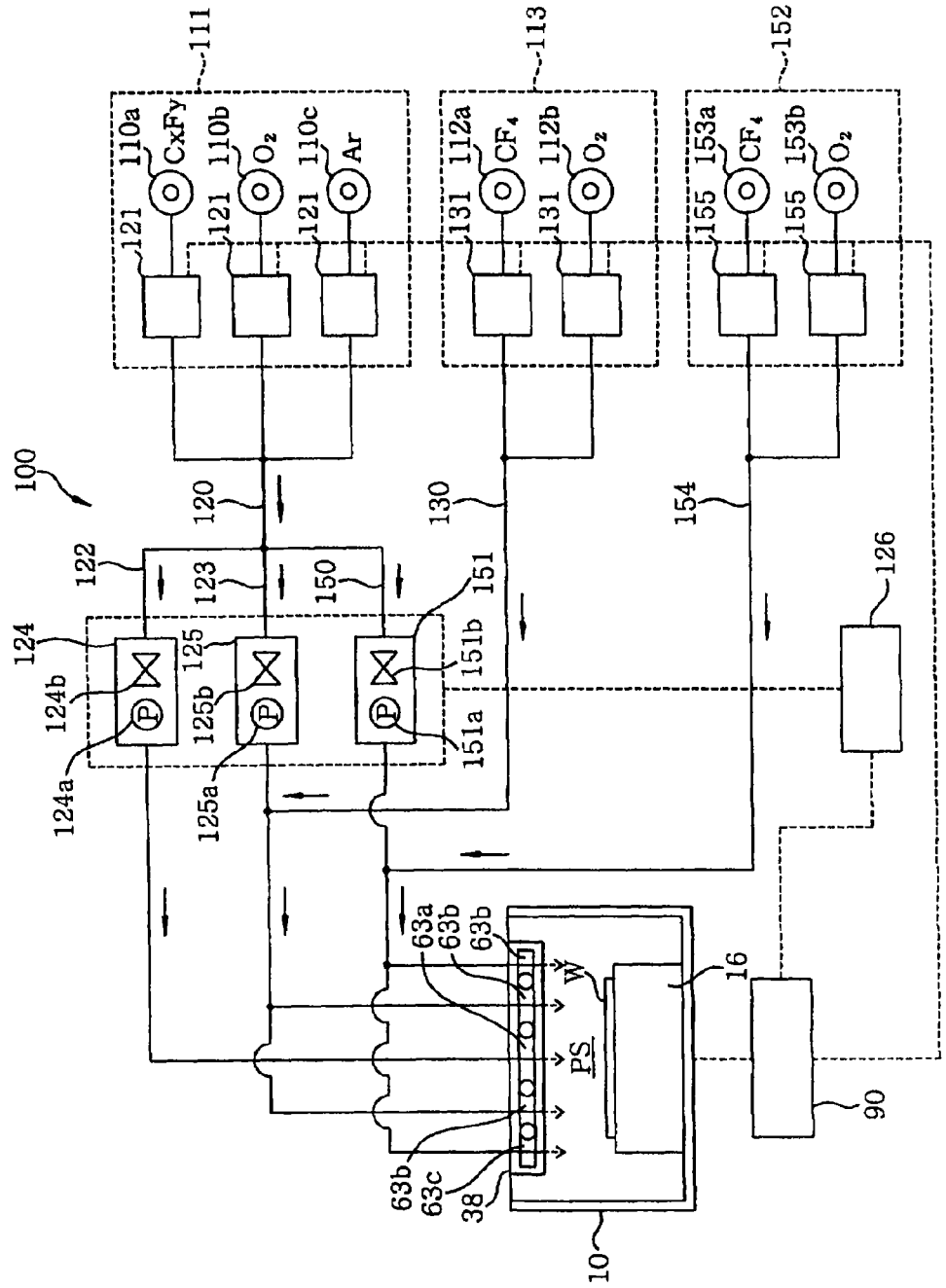
FIG. 5 shows a schematic configuration of a gas supply unit for supplying gaseous mixtures to three places in a processing chamber.

The gas supply unit 100 supplies gaseous mixtures to two places, i.e., the first and the second buffer space 63$a$ and 63$b$, in the processing chamber 10 in the preferred embodiment, but gaseous mixtures may be supplied to three places or more in the processing chamber 10. FIG. 5 shows such an example, wherein the inner upper electrode 38 includes a buffer space 63 having three buffer spaces concentrically disposed. That is, an annular third buffer space 63$c$ is formed further outside the second buffer space 63$b$ of the inner upper electrode 38. In this case, the mixing line 120 is branched into the first and the second branch line 122 and 123 and, further, a third branch line 150. The third branch line 150 is connected to the third buffer space 63$c$. Similarly to the branch lines 122 and 123, the third branch lime 150 is provided with a pressure control unit 151, a pressure gauge 151$a$ and a valve 151$b$. Further, the gas supply unit 100 in this example is provided with a third gas box 152 for supplying a specified additional gas to the third branch line 150. For example, the third gas box 152 has a same configuration as the second gas box 113 and includes an additional gas supply source 153$a$ of CF$_4$ gas and an additional gas supply source 153$b$ of O$_2$ gas. Both of the additional gas supply sources 153$a$ and 153$b$ are connected to the third branch line 150 via an additional gas supply line 154. Provided in the additional gas supply line 154 are mass flow controllers 155 for the additional gas supply sources 153$a$ and 153$b$, respectively. Further, the other configuration is same as in the above-mentioned preferred embodiment and, thus, the description thereof will be omitted.

Further, when gaseous mixtures are respectively supplied into the buffer spaces 63$a$ to 63$c$, gases from, e.g., the gas supply sources 110$a$ to 110$c$ of the first gas box 111 are supplied into the mixing line 120 to be mixed therein, thereby producing a gaseous mixture. The gaseous mixture is branched into three branch lines 122, 123 and 150. The gas pressure ratio of the branch lines 122, 123 and 150 is adjusted to be a specified target pressure ratio by the pressure ratio controller 126 and, then, opening degrees of the valves 124$b$, 125$b$ and 151$b$ are fixed. Accordingly, components and their flow rates in the gaseous mixture to be supplied to the first buffer space 63$a$ communicating with the first branch line 122 are set. Thereafter, an additional gas of a specified kind is supplied at a specified flow rate into the second branch line 123 from the second gas box 113 via the additional gas supply line 130. Further, an additional gas of a specified kind is supplied at a specified flow rate into the third branch line 150 from the third gas box 152 via the additional gas supply line 154. Accordingly, the components and flow rates in the gaseous mixtures supplied into the second and the third buffer space 63$b$ and 63$c$ are set. Also in this case, optional gaseous mixtures can be supplied into three places in the processing chamber 10 by a simple piping configuration.

Figure 6:
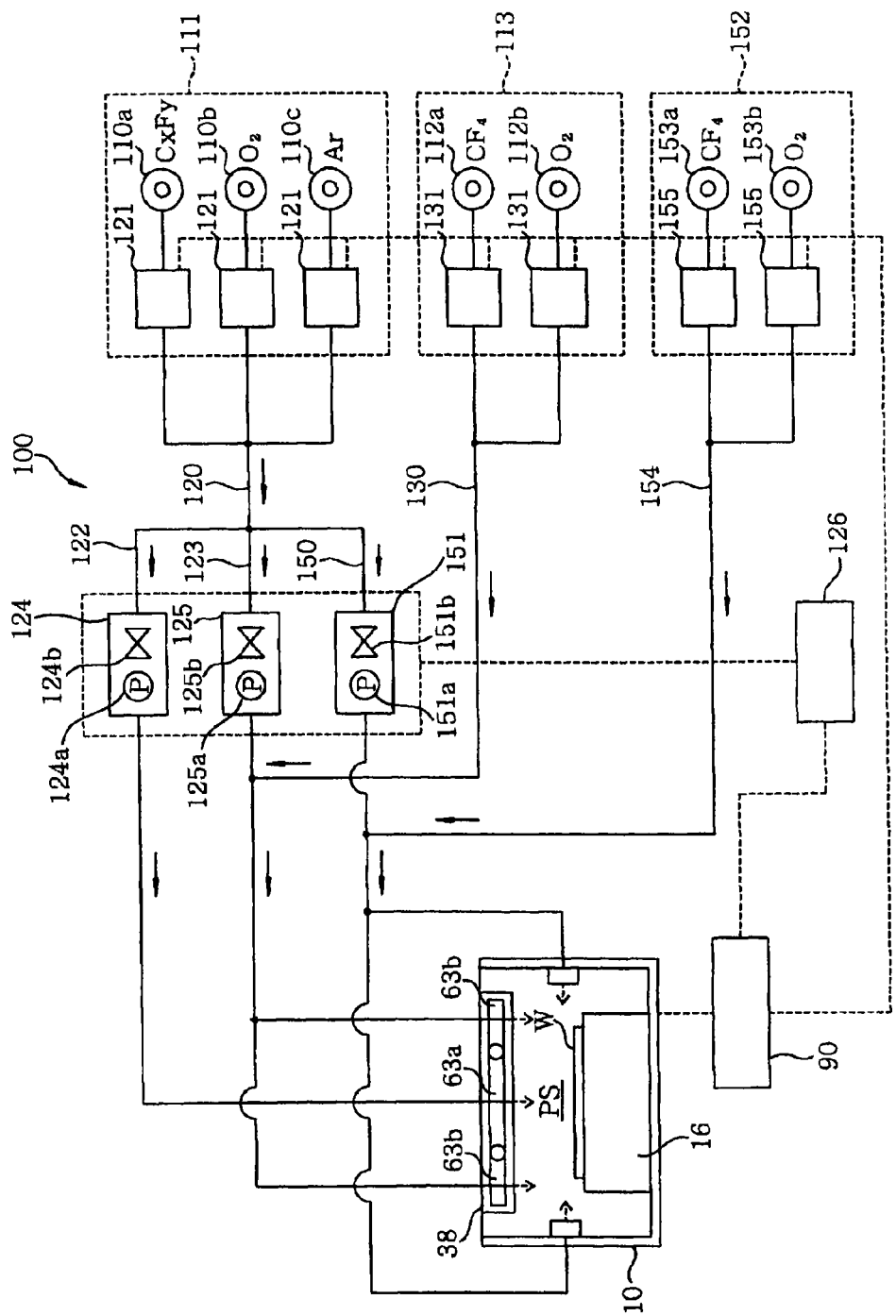
FIG. 6 shows a schematic configuration of a gas supply unit for supplying a gaseous mixture from a side surface portion of a processing chamber.

In the preferred embodiment, the gaseous mixtures supplied from the gas supply unit 100 are injected toward the wafer W through an upper portion of the processing chamber 10. However, the gaseous mixtures may be injected through another portion of the processing chamber 10, e.g., a side surface portion of the plasma generation space PS in the processing chamber 10. In such a case, for example, as shown in FIG. 6, the third branch line 150 is connected to both side surfaces of the processing chamber 10 and the gaseous mixtures are injected into the plasma generation space PS from nozzles connected to the both side surfaces of the processing chamber 10. In this case, specified gaseous mixtures can be supplied through an upper portion and a side portion of the plasma generation space PS, respectively. Therefore, a gas concentration in the plasma generation space PS can be adjusted, whereby an in-surface uniformity of an etching characteristic can be further improved on the wafer.

Although a flow rate of the branch line is adjusted by a pressure control unit in the preferred embodiment, it is possible to employ a mass flow controller. Further, although the gas supply unit 100 described in the preferred embodiment is for supplying the gaseous mixture to the plasma etching apparatus 1, the present invention can be applied to another substrate processing apparatus into which a gaseous mixture is supplied, e.g., a film forming apparatus such as a plasma CVD apparatus, a sputtering device and a thermal oxidation apparatus. Further, the present invention can be also applied to an apparatus for processing a substrate other than a wafer, e.g., FPD (flat panel display) and a mask reticle for photomask, and MEMS (Micro Electro Mechanical System) manufacturing apparatus and the like.

While the invention has been shown and described with respect to the preferred embodiment, it will be understood by those skilled in the art that various changes and modifications may be made without departing from the spirit and scope of the invention as defined in the following claims.

What is claimed is:

1. An etching gas supply unit for supplying at least a first etching gases and a second etching gas to a processing chamber of a plasma etching apparatus, the etching gas supply unit comprising:
   a plurality of first gas supply sources, each of which accommodates one of the first etching gases;
   a second gas supply source accommodating the second etching gas;
   a mixing portion to mix the first etching gases to make a gaseous mixture of the first etching gases;
   a multiplicity of branch flow passages to branch the gaseous mixture and supply the branched gaseous mixtures;
   a pressure control unit provided at each of the branch flow passages to adjust gas flow rates of the branched gaseous mixtures in the branch flow passages;
   a second etching gas supply passage to supply the second etching gas to at least one of the branch flow passages to which the second etching gas supply passage is connected; and
   a controller configured to control the following steps of:
   supplying the gaseous mixture of the first etching gases to the branch flow passages via the mixing portion;
   controlling a pressure ratio of the branched gaseous mixtures to be a specified pressure ratio by adjusting the pressure control units provided at the branch flow passages such that opening degrees of respective valves in the pressure control units are fixed under a condition in which the second etching gas is not supplied to any branch flow passage and, then, fixing the opening degrees of the valves;
   supplying the second etching gas at a specified flow rate to said at least one of the branch flow passages to which the second etching gas supply passage is connected while the opening degrees of the valves remained fixed; and injecting the first etching gases and the second etching gas toward the processing chamber.

2. The etching gas supply unit of claim 1, wherein the second etching gas supply passage is connected to all the branch flow passages.

3. The etching gas supply unit of claim 1, comprising a plurality of second gas supply sources.

4. An etching gas supply unit for supplying at least a first etching gases and a second etching gas to a processing chamber of a plasma etching apparatus, the etching gas supply unit comprising:
   a plurality of first gas supply sources, each of which accommodates one of the first etching gases;
   a second gas supply source accommodating the second etching gas;
   a mixing portion to mix the first etching gases to make a gaseous mixture of the first etching gases;
   a first branch flow passage to branch the gaseous mixture and supply a first gaseous mixture;
   a second branch flow passage to branch the gaseous mixture and supply a second gaseous mixture;
   a first pressure control unit provided at the first branch flow passage to adjust a gas flow rate of the first gaseous mixture in the first branch flow passage;
   a second pressure control unit provided at the second branch flow passage to adjust a gas flow rate of the second gaseous mixture in the second branch flow passage;
   a second etching gas supply passage to supply the second etching gas to at least one of the first branch flow passage and the second branch flow passage to which the second etching gas supply passage is connected; and
   a controller configured to control the following steps of:
   generating the gaseous mixture of the first etching gases;
   branching the gaseous mixture of the first etching gases to supply the first gaseous mixture to the first branch flow passage and supply the second gaseous mixture to the second branch flow passage via the mixing portion;
   controlling a pressure ratio of the first gaseous mixture to be a first pressure ratio and a pressure ratio of the second gaseous mixture to be a second pressure ratio by adjusting the first pressure control unit and the second pressure control unit such that opening degrees of respective valves in the first pressure control unit and the second pressure control unit are fixed under a condition in which the second etching gas is not supplied to any branch flow passage and, then, fixing the opening degrees of the valves;
   supplying the second etching gas at a specified flow rate to said at least one of the first branch flow passage and the second branch flow passage to which the second etching gas supply passage is connected while the opening degrees of the valves remained fixed; and
   injecting the first etching gases and the second etching gas toward the processing chamber.

5. A plasma etching apparatus for etching a substrate, the plasma etching apparatus comprising:
   a processing chamber;
   a gas introducing unit for introducing at least a first etching gases and a second etching gas into the processing chamber, the gas introducing unit including a plurality of buffer spaces;
   an etching gas supply unit for supplying the first etching gases and the second etching gas to the buffer spaces; and
   a plasma generating unit for generating a plasma of the first etching gases and the second etching gas in the processing chamber,
   wherein the etching gas supply unit comprises:
   a plurality of first gas supply sources, each of which accommodates one of the first etching gases;
   a second gas supply source accommodating the second etching gas;
   a mixing portion to mix the first etching gases to make a gaseous mixture of the first etching gases;
   a multiplicity of branch flow passages to branch the gaseous mixture and supply the branched gaseous mixtures;
   a pressure control unit provided at each of the branch flow passages to adjust gas flow rates of the branched gaseous mixtures in the branch flow passages;
   a second etching gas supply passage to supply the second etching gas to at least one of the branch flow passages to which the second etching gas supply passage is connected; and
   a controller configured to control the following steps of:
   supplying the gaseous mixture of the first etching gases to the branch flow passages via the mixing portion;
   controlling a pressure ratio of the branched gaseous mixtures to be a specified pressure ratio by adjusting the pressure control units provided at the branch flow passages such that opening degrees of respective valves in the pressure control units are fixed under a condition in which the second etching gas is not supplied to any branch flow passage and, then, fixing the opening degrees of the valves;
   supplying the second etching gas at a specified flow rate to said at least one of the branch flow passages to which the second etching gas supply passage is connected while the opening degrees of the valves remained fixed; and
   injecting the first etching gases and the second etching gas toward the processing chamber.

6. The plasma etching apparatus of claim 5, wherein the second etching gas supply passage is connected to all the branch flow passages.

7. The plasma etching apparatus of claim 6, the etching gas supply unit comprises a plurality of second gas supply sources.

8. The plasma etching apparatus of claim 5, the etching gas supply unit comprises a plurality of second gas supply sources.

9. A gas supplying method using an etching gas supply unit for supplying at least a first etching gases and a second etching gas to a processing chamber of a plasma etching apparatus, the etching gas supply unit comprising:
   a plurality of first gas supply sources, each of which accommodates one of the first etching gases;
   a second gas supply source accommodating the second etching gas;
   a mixing portion to mix the first etching gases to make a gaseous mixture of the first etching gases;
   a multiplicity of branch flow passages to branch the gaseous mixture and supply the branched gaseous mixtures;
   a pressure control unit provided at each of the branch flow passages to adjust gas flow rates of the branched gaseous mixtures in the branch flow passages; and
   a second etching gas supply passage to supply the second etching gas to at least one of the branch flow passages to which the second etching gas supply passage is connected, wherein the method comprises the following steps of:
generating the gaseous mixture of the first etching gases by supplying the first etching gases to the mixing portion;
supplying the gaseous mixture of the first etching gases to the branch flow passages via the mixing portion;
controlling a pressure ratio of the branched gaseous mixtures to be a specified pressure ratio by adjusting the pressure control units provided at the branch flow passages such that opening degrees of respective valves in the pressure control units are fixed under a condition in which the second etching gas is not supplied to any branch flow passage and, then, fixing the opening degrees of the valves;
supplying the second etching gas at a specified flow rate to said at least one of the branch flow passages to which the second etching gas supply passage is connected while the opening degrees of the valves remained fixed to thereby inject the first etching gases and the second etching gas toward the processing chamber.

10. A gas supplying method for etching a substrate by using a plasma etching apparatus, the plasma etching apparatus comprising:
a processing chamber;
a gas introducing unit for introducing at least a first etching gases and a second etching gas into the processing chamber, the gas introducing unit including a plurality of buffer spaces;
an etching gas supply unit for supplying the first etching gases and the second etching gas to the buffer spaces; and
a plasma generating unit for generating a plasma of the first etching gases and the second etching gas in the processing chamber,
wherein the etching gas supply unit comprises:
a plurality of first gas supply sources, each of which accommodates one of the first etching gases;
a second gas supply source accommodating the second etching gas;
a mixing portion to mix the first etching gases to make a gaseous mixture of the first etching gases;
a multiplicity of branch flow passages to branch the gaseous mixture and supply the branched gaseous mixtures;
a pressure control unit provided at each of the branch flow passages to adjust gas flow rates of the branched gaseous mixtures in the branch flow passages; and
a second etching gas supply passage to supply the second etching gas to at least one of the branch flow passages to which the second etching gas supply passage is connected,
wherein the method comprises the following steps of:
placing the substrate in the processing chamber;
supplying, by using the etching gas supply unit, the first etching gases and the second etching gas to the processing chamber via the shower head;
generating the plasma of the first etching gases and the second etching gas by using the plasma generating unit in the processing chamber; and
etching the substrate by the plasma,
wherein said supplying, by using the etching gas supply unit, the first etching gases and the second etching gas comprises the following steps of:
generating the gaseous mixture of the first etching gases;
branching the gaseous mixture of the first etching gases to supply the gaseous mixture to the branch flow passages via the mixing portion;
controlling a pressure ratio of the branched gaseous mixtures to be a specified pressure ratio by adjusting the pressure control units provided at the branch flow passages such that opening degrees of respective valves in the pressure control units are fixed under a condition in which the second etching gas is not supplied to any branch flow passage and, then, fixing the opening degrees of the valves;
supplying the second etching gas at a specified flow rate to said at least one of the branch flow passages to which the second etching gas supply passage is connected while the opening degrees of the valves remained fixed; and
injecting the first etching gases and the second etching gas toward the processing chamber.

11. A gas supply unit for supplying at least a first gases and a second gas to a processing chamber of a processing apparatus, the gas supply unit comprising:
a plurality of first gas supply sources, each of which accommodates one of the first gases;
a second gas supply source accommodating the second gas;
a mixing portion to mix the first gases to make a gaseous mixture of the first gases;
a multiplicity of branch flow passages to branch the gaseous mixture and supply the branched gaseous mixtures;
a pressure control unit provided at each of the branch flow passages to adjust gas flow rates of the branched gaseous mixtures in the branch flow passages;
a second gas supply passage to supply the second gas to at least one of the branch flow passages to which the second gas supply passage is connected; and
a controller configured to control the following steps of:
supplying the gaseous mixture of the first gases to the branch flow passage via the mixing portion;
controlling a pressure ratio of the branched gaseous mixtures to be a specified pressure ratio by adjusting the pressure control units provided at the branch flow passages such that opening degrees of respective valves in the pressure control units are fixed under a condition in which the second gas is not supplied to any branch flow passage and, then, fixing the opening degrees of the valves;
supplying the second gas at a specified flow rate to said at least one of the branch flow passages to which the second gas supply passage is connected while the opening degrees of the valves remained fixed; and
injecting the first gases and the second gas toward the processing chamber.

12. A gas supply unit for supplying at least a first gases and a second gas to a processing chamber of a processing apparatus, the gas supply unit comprising:
a plurality of first gas supply sources, each of which accommodates one of the first gases;
a second gas supply source accommodating the second gas;
a mixing portion to mix the first gases to make a gaseous mixture of the first gases;
a first branch flow passage to branch the gaseous mixture and supply a first gaseous mixture;
a second branch flow passage to branch the gaseous mixture and supply a second gaseous mixture;
a first pressure control unit provided at the first branch flow passage to adjust a gas flow rate of the first gaseous mixture in the first branch flow passage;

a second pressure control unit provided at the second branch flow passage to adjust a gas flow rate of the second gaseous mixture in the second branch flow passage;

a second gas supply passage to supply the second gas to at least one of the first branch flow passage and the second branch flow passage to which the second gas supply passage is connected; and a controller configured to control the following steps of:

generating the gaseous mixture of the first gases;

branching the gaseous mixture of the first gases to supply the first gaseous mixture to the first branch flow passage and supply the second gaseous mixture to the second branch flow passage via the mixing portion;

controlling a pressure ratio of the first gaseous mixture to be a first pressure ratio and a pressure ratio of the second gaseous mixture to be a second pressure ratio by adjusting the first pressure control unit and the second pressure control unit such that opening degrees of respective valves in the first pressure control unit and the second pressure control unit are fixed under a condition in which the second gas is not supplied to any branch flow passage and, then, fixing the opening degrees of the valves;

supplying the second gas at a specified flow rate to said at least one of the first branch flow passage and the second branch flow passage to which the second gas supply passage is connected while the opening degrees of the valves remained fixed; and injecting the first gases and the second gas toward the processing chamber.

\* \* \* \* \*